United States Patent
Wanibuchi

(10) Patent No.: US 9,553,595 B2
(45) Date of Patent: Jan. 24, 2017

(54) CLOCK OPERATION METHOD AND CIRCUIT

(71) Applicant: MegaChips Corporation, Osaka (JP)

(72) Inventor: Tomohiro Wanibuchi, Chiba (JP)

(73) Assignee: MegaChips Corporation, Osaka (JP)

(*) Notice: Subject to any disclaimer, the term of this patent is extended or adjusted under 35 U.S.C. 154(b) by 174 days.

(21) Appl. No.: 14/614,783

(22) Filed: Feb. 5, 2015

(65) Prior Publication Data

US 2015/0222283 A1   Aug. 6, 2015

(30) Foreign Application Priority Data

Feb. 5, 2014 (JP) .................... 2014-020557

(51) Int. Cl.
| | |
|---|---|
| *G06F 1/10* | (2006.01) |
| *H03L 7/18* | (2006.01) |
| *H03K 5/153* | (2006.01) |
| *G06F 1/08* | (2006.01) |
| *G06F 1/12* | (2006.01) |
| *H03K 23/66* | (2006.01) |

(52) U.S. Cl.
CPC . *H03L 7/18* (2013.01); *G06F 1/08* (2013.01); *G06F 1/10* (2013.01); *H03K 5/153* (2013.01); *G06F 1/12* (2013.01); *H03K 23/66* (2013.01)

(58) Field of Classification Search
None
See application file for complete search history.

(56) References Cited

U.S. PATENT DOCUMENTS

| | | | | |
|---|---|---|---|---|
| 5,281,861 | A * | 1/1994 | Tran ................. | H03K 19/01806 326/93 |
| 5,313,476 | A * | 5/1994 | Haberkorn, Jr. ...... | G06F 11/267 326/93 |
| 5,414,381 | A * | 5/1995 | Nelson ...................... | G06F 1/10 327/262 |
| 5,923,188 | A * | 7/1999 | Kametani ................. | G06F 1/10 326/101 |
| 5,986,055 | A * | 11/1999 | Yang ................... | C07K 14/4738 530/300 |
| 6,441,656 | B1 * | 8/2002 | Yee .......................... | G06F 1/06 327/115 |
| 2006/0250173 | A1* | 11/2006 | Yang ........................ | G06F 1/10 327/291 |

(Continued)

FOREIGN PATENT DOCUMENTS

| | | |
|---|---|---|
| JP | 2005-038159 A | 2/2005 |
| JP | 2007-189293 A | 7/2007 |

*Primary Examiner* — Tuan T Lam
(74) *Attorney, Agent, or Firm* — Osha Liang LLP

(57) ABSTRACT

In a clock generating circuit, a variable frequency division circuit generates a variable divided clock by dividing a source clock in accordance with a division ratio setting signal. A first clock synchronization circuit generates a first delayed clock that is delayed by a maximum number of clocks from the variable divided clock in synchronization with the source clock and supplies the first delayed clock to a control circuit. One or more second clock synchronization circuits generate one or more second delayed clocks, each of which is delayed by the maximum number of clocks from the variable divided clock in synchronization with the source clock, and supply each of the one or more second delayed clocks to each of one or more functional modules.

9 Claims, 8 Drawing Sheets

(56) References Cited

U.S. PATENT DOCUMENTS

| | | | |
|---|---|---|---|
| 2007/0159226 A1 | 7/2007 | Hayakawa | |
| 2007/0182475 A1* | 8/2007 | Shimazaki | G06F 1/10 327/295 |
| 2008/0115005 A1* | 5/2008 | Kamada | G06F 1/10 713/501 |
| 2009/0079488 A1* | 3/2009 | Motoyoshi | G06F 1/10 327/297 |
| 2009/0267674 A1* | 10/2009 | Hyun Hwang | G11C 7/222 327/295 |
| 2013/0214816 A1* | 8/2013 | Thornton | G06F 1/10 326/93 |

* cited by examiner

CLOCK OPERATION METHOD AND CIRCUIT

CROSS-REFERENCE TO RELATED APPLICATIONS

The present application claims priority under 35 U.S.C. §119 to Japanese Patent Application No. 2014-020557, filed Feb. 5, 2014. The priority application is hereby expressly incorporated by reference, in its entirety, into the present application.

BACKGROUND OF THE INVENTION

One or more embodiments of the present invention generally relate to a clock generating method and a clock generating circuit for generating a clock to be supplied to a control circuit and a functional module in a semiconductor chip on which the functional module and the control circuit controlling the operation of the functional module by communication with the functional module are mounted.

With the progress of segmentalization in the manufacturing process of semiconductor integrated circuits, the semiconductor chips increase in size and are multi-functionalized. For example, in a design technique for semiconductor integrated circuit called system-on-chip (SOC), in addition to one or more functional modules each performing a predetermined function, a control circuit, such as a central processing unit (CPU), which controls the operations of the functional modules by communicating therewith, may be mounted on a semiconductor chip. Further, suppression of stand-by power consumption of a circuit has been carried out by means of lowering the frequency of an operation clock when the circuit does not operate.

When a semiconductor chip increases in size, a physical wiring distance of an operation clock connected to the functional modules from a clock generating circuit may increase up to several millimeters. Accordingly, even when the control circuit and the functional modules are connected to the same operation clock, the functional modules are supplied with operation clocks that are delayed depending on the wiring distance and of which the phases deviate from the phase of the operation clock supplied to the control circuit. Thus, the control circuit and the functional modules may not correctly communicate with each other.

JP 2005-38159 A (Patent document 1) describes that a master clock signal is divided and output as a first divided clock signal, a clock skew of a second divided clock signal is reduced by synchronizing the first divided clock signal with the master clock signal to output the second divided clock signal, and the second divided clock signal having the same phase as the first divided clock signal is supplied to plural logic circuits in a semiconductor chip.

JP 2007-189293 A (Patent document 2) describes that a first clock signal is divided to generate a second clock signal, and a third clock signal having the period of the second clock signal and having the same timing of change in logic level as that of the first clock signal is generated from the first and second clock signals, whereby a skew due to on-chip variation of transmission lines of the first clock signal and the third clock signal is suppressed and timing closure is improved.

In Patent documents 1 and 2, the divided clocks are held again in synchronization with the source clock to generate a regenerated clock and distributing the regenerated clock to the functional modules so as to suppress an influence of OCV (on-chip variation: characteristic variation in the same semiconductor chip). However, in Patent documents 1 and 2, when the division ratio of the divided clocks is variable, the phases of the divided clocks supplied to the control circuit and the functional modules deviate from each other due to flip-flops (FF) for generating the regenerated clocks, of which the number of stages is fixed. Thus, the control circuit and the functional modules cannot correctly communicate with each other.

FIG. 7 is a circuit diagram illustrating an example of a configuration of a conventional clock generating circuit. In a semiconductor chip on which functional modules (A and B) 14 and 16 and a control circuit 12 controlling the operations of the functional modules 14 and 16 by communicating therewith are mounted, a clock generating circuit 56 illustrated in the drawing generates delayed clocks to be supplied to the control circuit 12 and the functional modules 14 and 16, and includes a frequency division circuit 58 and clock synchronization circuits 60 and 62.

The frequency division circuit 58 divides a source clock by m (where m is an integer equal to or greater than 2) to generate a divided clock having a 1/m frequency of the frequency of the source clock.

The clock synchronization circuit 60 generates delayed clock A by delaying the divided clock by four clocks in synchronization with the source clock and supplies generated delayed clock A to the functional module 14 operating in synchronization with delayed clock A.

The clock synchronization circuit 62 generates delayed clock B by delaying the divided clock by two clocks in synchronization with the source clock and supplies generated delayed clock B to the functional module 16 operating in synchronization with delayed clock B.

When the clock synchronization circuits 60 and 62 are not provided, the functional modules 14 and 16 are supplied with variable divided clocks, which are delayed depending on the wiring distances.

The number of clocks, such as four clocks and two clocks, by which the divided clock is delayed by the clock synchronization circuits 60 and 62 is the number of clocks by which it is necessary to delay the variable divided clocks in synchronization with the source clock, and is calculated for each of the variable divided clocks connected to the functional modules 14 and 16 depending on the wiring distance of each of the divided clocks connected to the functional modules 14 and 16 from the frequency division circuit 58 when the clock synchronization circuits 60 and 62 are not provided, in order to operate the control circuit 12 and the functional modules 14 and 16 in synchronization with the divided clocks.

The clock synchronization circuit 60 includes FFs (delay circuits) 64, 66, 68, and 70 respectively at four stages connected in series, in accordance with four clocks to be delayed. The source clock is input to clock input terminals of the FFs 64, 66, 68, and 70, and the divided clock is input to a data input terminal of the FF 64 at the first stage. Regenerated clocks 1 to 3 and delayed clock A are output from data output terminals of the FFs 64, 66, 68, and 70, respectively.

The divided clock is delayed by one clock by each of FFs 64, 66, 68, and 70 at four stages in synchronization with the rising of the source clock. As a result, delayed clock A, which is delayed by four clocks of the source clock from the divided clock, is output from the clock synchronization circuit 60.

Similarly, the clock synchronization circuit 62 includes FFs 72 and 74 respectively at two stages connected in series in accordance with two clocks to be delayed. The source clock is input to clock input terminals of the FFs 72 and 74, and the divided clock is input to a data input terminal of the FF 72 at the first stage. Regenerated clock 1 and delayed clock B are output from data output terminals of the FFs 72 and 74, respectively.

The divided clock is delayed by one clock by each of the FFs 72 and 74 at two stages in synchronization with the rising of the source clock. As a result, delayed clock B, which is delayed by two clocks of the source clock from the divided clock, is output from the clock synchronization circuit 62.

In the clock generating circuit 56, the source clock is in-divided by the frequency division circuit 58, and, thus, a divided clock is generated.

Subsequently, delayed clock A, which is delayed by four clocks from the divided clock, is generated in synchronization with the rising of the source clock by the clock synchronization circuit 60. Delayed clock A is supplied to the functional module 14. Delayed clock B, which is delayed by two clocks from the divided clock, is generated in synchronization with the rising of the source clock by the clock synchronization circuit 62. Delayed clock B is supplied to the functional module 16.

FIG. 8 is a timing diagram illustrating an example of an operation of the clock generating circuit illustrated in FIG. 7 when the divided clock is a two-divided clock.

When the divided clock is a two-divided clock, the divided clock is alternately changed between a high level and a low level in synchronization with the rising of the source clock as illustrated in the timing diagram. Regenerated clocks 1 to 3 are changed in level in synchronization with the rising of the source clock as well and are delayed by one to three clocks of the source clock from the divided clock, respectively. Delayed clocks A and B are changed in level in synchronization with the rising of the source clock and are delayed by four clocks and two clocks of the source clock from the divided clock, respectively.

Accordingly, because delayed clocks A and B and the divided clock are synchronized and matched in phase, the control circuit 12 can correctly communicate with the functional modules 14 and 16 to control the operations thereof.

FIG. 9 is a timing diagram illustrating an example of an operation example of the clock generating circuit illustrated in FIG. 7 when the divided clock is a five-divided clock.

When the divided clock is a five-divided clock, the divided clock is alternately changed between a high level and a low level in synchronization with the rising of the source clock, as illustrated in the timing diagram. The high level of the divided clock is set to have a pulse width of two clocks of the source clock and the low level is set to have a pulse width of three clocks of the source clock. Regenerated clocks 1 to 3 are changed in level in synchronization with the rising of the source clock as well and are delayed by one to three clocks of the source clock from the divided clock, respectively. Delayed clocks A and B are changed in level in synchronization with the rising of the source clock and are delayed by four clocks and two clocks of the source clock from the divided clock, respectively.

Accordingly, because delayed clocks A and B and the divided clock are synchronized but deviate from each other in phase, the control circuit 12 cannot correctly communicate with the functional modules 14 and 16.

The configuration of the clock synchronization circuits 60 and 62 of the clock generating circuit 56 is provided for a case in which the divided clock is fixed to the two-divided clock. Accordingly, in the configuration of the clock generating circuit 56, when the divided clock is changed from the two-divided clock to a divided clock of a different division ratio, delayed clocks A and B and the divided clock deviate from each other in phase. Accordingly, the control circuit 12 cannot correctly communicate with the functional modules 14 and 16 and cannot control the operations thereof.

SUMMARY OF THE INVENTION

One or more embodiments of the present invention provide a clock generating circuit that allows a control circuit to correctly communicate with functional modules to control the operations thereof even when a division ratio of a divided clock is changed.

One or more embodiments of the present invention provides a clock generating method of generating delayed clocks to be supplied to each of one or more functional modules and a control circuit that controls operations of the one or more functional modules in a semiconductor chip on which the one or more functional modules and the control circuit are mounted, the clock generating method comprising steps of:

generating a variable divided clock by dividing a source clock in accordance with a division ratio setting signal;

calculating one or more numbers of clocks by each of which the variable divided clock is delayed in synchronization with the source clock for each of the variable divided clocks connected to the one or more functional modules depending on a wiring distance of each of the variable divided clocks connected to the one or more functional modules from a variable frequency division circuit that generates the variable divided clock when a clock synchronization circuit delaying the variable divided clock is not provided, in order to operate the control circuit and each of the one or more functional modules in synchronization with the variable divided clock;

calculating a maximum number of clocks that is a number of clocks greater than or equal to a largest number of clocks out of the calculated numbers of clocks;

generating a first delayed clock, wherein the first delayed clock is delayed by the maximum number of clocks from the variable divided clock, in synchronization with the source clock and supplying the first delayed clock to the control circuit operating in synchronization with the first delayed clock; and generating one or more second delayed clocks, each of which is delayed by the maximum number of clocks from the variable divided clock, in synchronization with the source clock and supplying each of the one or more second delayed clocks to each of the one or more functional modules operating in synchronization with each of the one or more second delayed clocks.

One or more embodiments of the present invention also provides a clock generating circuit for generating delayed clocks to be supplied to each of one or more functional modules and a control circuit that controls operations of the one or more functional modules in a semiconductor chip on which the one or more functional modules and the control circuit are mounted, the clock generating circuit comprising:

a variable frequency division circuit configured to generate a variable divided clock by dividing a source clock in accordance with a division ratio setting signal;

a first clock synchronization circuit configured to generate a first delayed clock, wherein the first delayed clock is delayed by a predetermined maximum number of clocks from the variable divided clock, in synchronization with the source clock and to supply the first delayed clock to the control circuit operating in synchronization with the first delayed clock; and one or more second clock synchronization circuits configured to generate one or more second delayed clocks, each of which is delayed by the maximum number of clocks from the variable divided clock, in synchronization with the source clock and to supply each of the one or more second delayed clocks to each of the one or more functional modules operating in synchronization with each of the one or more second delayed clocks, wherein the maximum number of clocks is a number of clocks greater than or equal to a largest number of clocks out of numbers of clocks by each of which the variable divided clock is delayed in synchronization with the source clock, and is calculated for each of the variable divided clocks connected to the one or more functional modules depending on a wiring distance of each of the variable divided clocks connected to the one or more functional modules from the variable frequency division circuit when the first clock synchronization circuit and the one or more second clock synchronization circuits are not provided, in order to operate the control circuit and each of the one or more functional modules in synchronization with the variable divided clock.

In the clock generating circuit according to one or more embodiments of the present invention, the delayed clocks, which are delayed by predetermined numbers of clocks of the source clock from the variable divided clock, are generated. Therefore, the delayed clocks are always synchronized and matched in phase regardless of the division ratio of the variable divided clock. Accordingly, even when the division ratio of the variable divided clock is changed, the delayed clocks are always synchronized and matched in phase. Thus, the control circuit can correctly communicate with the functional modules to control the operations thereof.

DETAILED DESCRIPTION OF THE INVENTION

Hereinafter, a clock generating circuit according to one or more embodiments of the present invention is described in detail with reference to the accompanying drawings.

Figure 1:
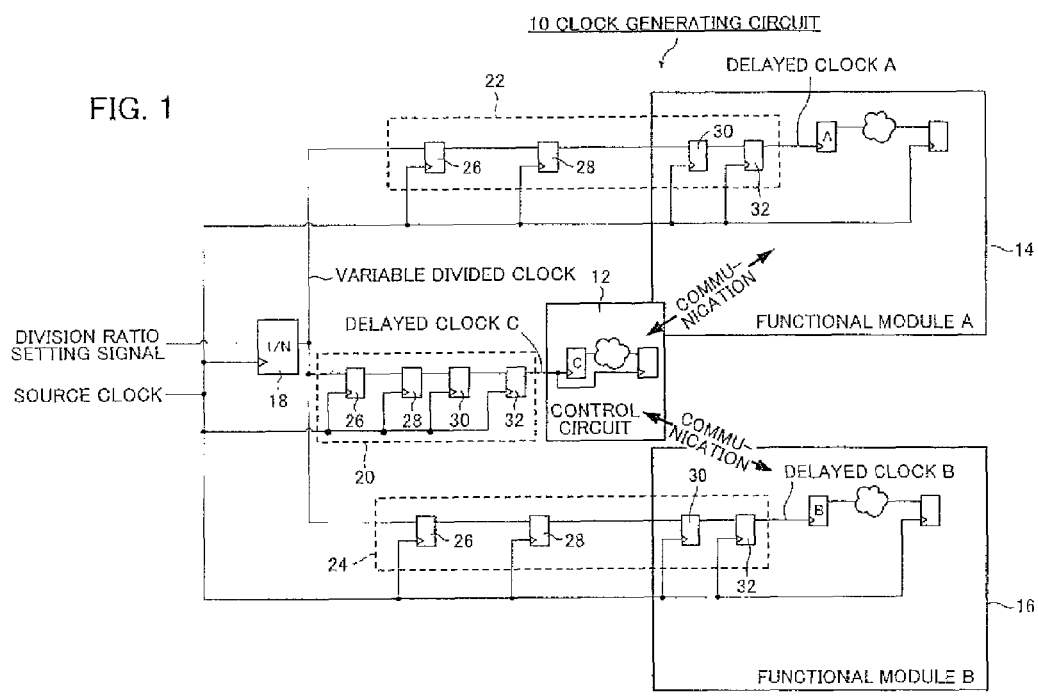
FIG. 1 is a circuit diagram illustrating a configuration of a clock generating circuit according to one or more embodiments of the present invention.

FIG. 1 is a circuit diagram illustrating a configuration of a clock generating circuit according to according to one or more embodiments of the present invention. In a semiconductor chip, on which functional modules (A and B) 14 and 16 and a control circuit 12 communicating with the functional modules 14 and 16 to control the operations thereof are mounted, a clock generating circuit 10 illustrated in the drawing generates delayed clocks to be supplied to the control circuit 12 and each of the functional modules 14 and 16. The clock generating circuit 10 comprises a variable frequency division circuit 18 and clock synchronization circuits 20, 22, and 24.

The variable frequency division circuit 18 divides a source clock by N (where N is an integer greater than or equal to 2, which is determined by a division ratio setting signal) in accordance with a division ratio setting signal. The division circuit 18 generates a variable divided clock having a division ratio corresponding to the division ratio setting signal, i.e., a 1/N frequency of the frequency of the source clock.

The division ratio setting signal and the source clock are input, for example, from the outside of the semiconductor chip or from another functional module mounted on the semiconductor chip.

Subsequently, the clock synchronization circuit 20 generates delayed clock C, which is delayed by a predetermined maximum number of clocks from the variable divided clock, in synchronization with the source clock. The clock synchronization circuit 20 supplies generated delayed clock C to the control circuit 12 operating in synchronization with delayed clock C.

When the clock synchronization circuits 22 and 24 are not provided, the functional modules 14 and 16 are supplied with the variable divided clocks, which are delayed depending on wiring distances.

The maximum number of clocks is the number of clocks that is greater than or equal to the largest number of clocks out of the numbers of clocks by which the variable divided clock is delayed in synchronization with the source clock, and is calculated for each of the variable divided clocks connected to the functional modules 14 and 16 depending on the wiring distance of each of the variable divided clocks connected to the functional modules 14 and 16 from the variable frequency division circuit 18 when the clock synchronization circuits 22 and 24 are not provided, in order to operate the control circuit 12 and each of the functional modules 14 and 16 in synchronization with the variable divided clock.

By setting the maximum number of clocks to the largest number of clocks out of the numbers of clocks by which each of the variable divided clocks connected to the functional modules 14 and 16 is delayed, the circuit scale of the clock synchronization circuits 20, 22, and 24 can be limited to a minimum necessary.

The clock synchronization circuit 20 is designed for a case in which the maximum number of clocks is four clocks, and includes FFs (delay circuits) 26, 28, 30, and 32 at four stages connected in series accordingly. The source clock is input to clock input terminals of the FFs 26, 28, 30, and 32, and the variable divided clock is input to a data input terminal of FF 26 at the first stage. Regenerated clocks 1 to 3 and delayed clock C are output from data output terminals of the FFs 26, 28, 30, and 32, respectively.

The variable divided clock is delayed by one clock by each of the FFs 26, 28, 30, and 32 at four stages in synchronization with the rising of the source clock. As a result, delayed clock C, which is delayed by four clocks of the source clock from the variable divided clock, is output from the clock synchronization circuit 20.

Similarly, the clock synchronization circuit 22 generates delayed clock A, which is delayed by the maximum number of clocks from the variable divided clock in synchronization with the source clock. The clock synchronization circuit 22 supplies generated delayed clock A to the functional module 14 operating in synchronization with delayed clock A.

The clock synchronization circuit 24 generates delayed clock B, which is delayed by the maximum number of clocks from the variable divided clock in synchronization with the source clock. The clock synchronization circuit 24 supplies generated delayed clock B to the functional module 16 operating in synchronization with delayed clock B.

The clock synchronization circuits 22 and 24 have the same configuration as the clock synchronization circuit 20, FFs 26 and 28 at two stages in the first half out of FFs 26, 28, 30, and 32 at four stages are disposed outside the functional modules 14 and 16, and FFs 30 and 32 at two stages in the second half are disposed inside the functional modules 14 and 16. Delayed clocks A and B are supplied to the internal circuits of the functional modules 14 and 16 operating in synchronization with delayed clocks A and B, respectively. In this way, the delay circuits constituting the clock synchronization circuits 22 and 24 may be disposed inside the functional modules 14 and 16 as well as outside the functional modules 14 and 16.

A method of calculating the maximum number of clocks and the operation of the clock generating circuit 10 illustrated in FIG. 1 is described below with reference to the flowcharts illustrated in FIGS. 2 and 3.

Figure 2:
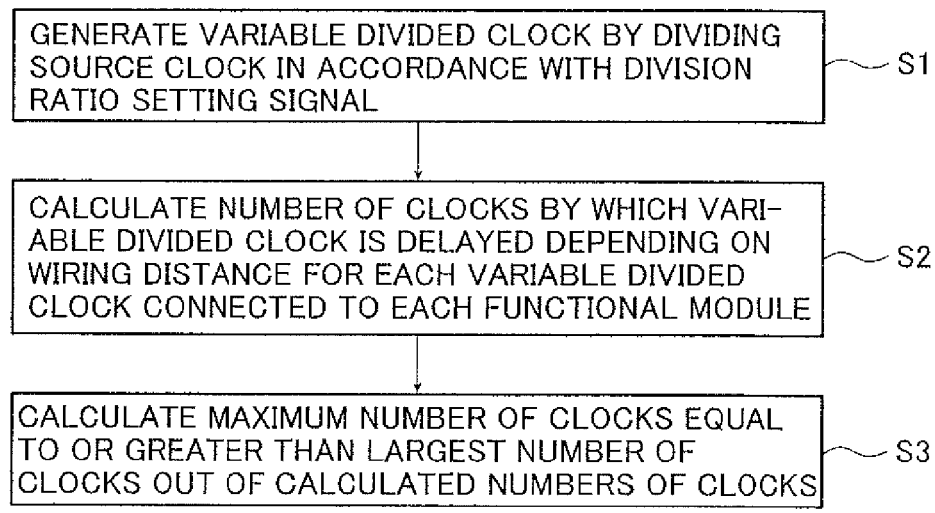
FIG. 2 is a flowchart illustrating an example of calculating a maximum number of clocks according to one or more embodiments of the present invention.

At the time of calculating the maximum number of clocks, a variable divided clock is first generated in accordance with a division ratio setting signal by the variable frequency division circuit 18 by dividing the source clock (step S1 in FIG. 2).

As described above, when the clock synchronization circuits 22 and 24 are not provided, the functional modules 14 and 16 are supplied with the variable divided clocks delayed depending on the wiring distances from the variable frequency division circuit 18.

Subsequently, in order to operate the control circuit 12 and the functional modules 14 and 16 in synchronization with the variable divided clocks, the numbers of clocks by which each variable divided clock is delayed in synchronization with the source clock is calculated for each of the variable divided clocks connected to the functional modules 14 and 16 depending on each of the wiring distances of the variable divided clocks connected to the functional modules 14 and 16 (step S2 in FIG. 2).

Then, the maximum number of clocks, which is greater than or equal to the largest number of clocks out of the calculated numbers of clocks, is calculated (step S3 in FIG. 2).

Figure 7:
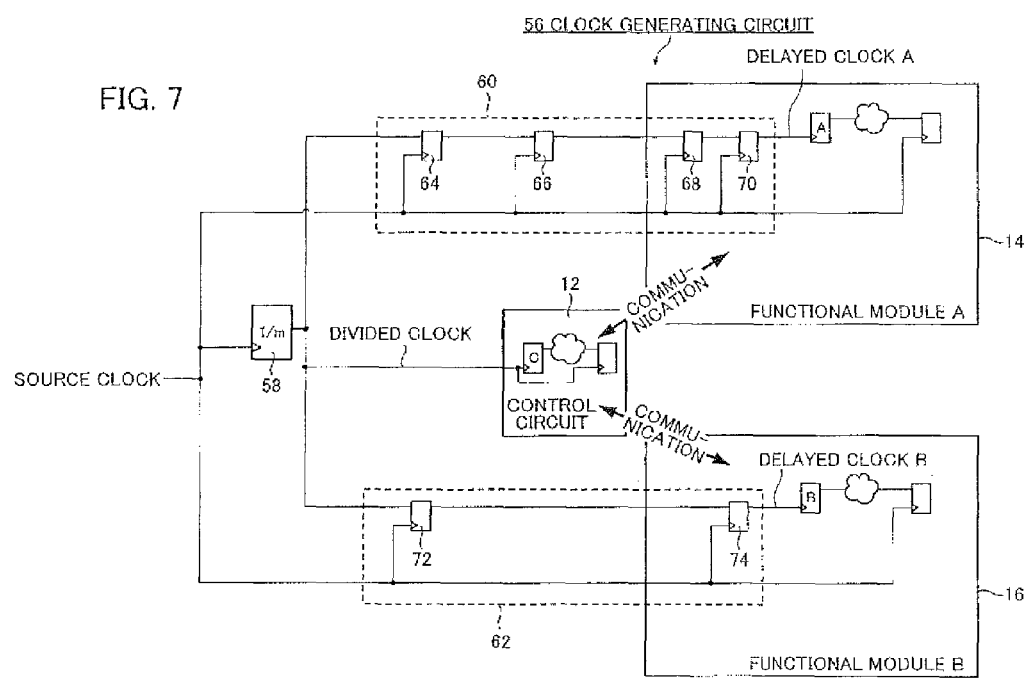
FIG. 7 is a circuit diagram illustrating an example of a configuration of a conventional clock generating circuit according to one or more embodiments of the present invention.

As in the conventional clock generating circuit 56 illustrated in FIG. 7, when the numbers of clocks by which the variable divided clocks connected to the functional modules 14 and 16 are delayed are four clocks and two clocks, for example, the maximum number of clocks is set to four clocks. In this case, as illustrated in FIG. 1, the number of stages of the FFs constituting the clock synchronization circuits 20, 22, and 24 is four.

Figure 3:
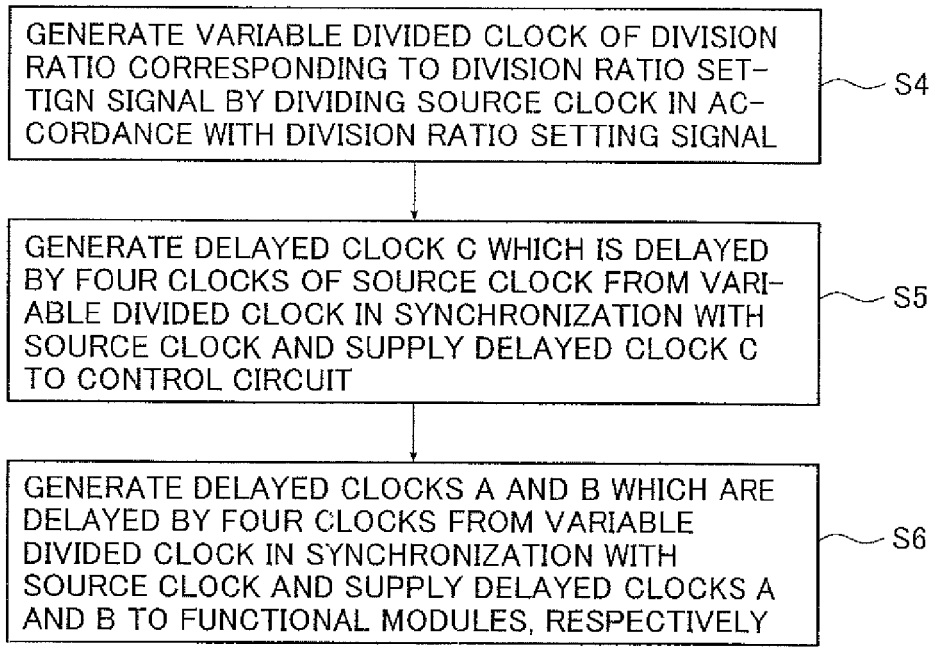
FIG. 3 is a flowchart illustrating an example of an operation of the clock generating circuit illustrated in FIG. 1.

In the clock generating circuit 10, the source clock is divided in accordance with the division ratio setting signal by the variable frequency division circuit 18, and a variable divided clock corresponding to the division ratio setting signal is generated (step S4 in FIG. 3).

Subsequently, delayed clock C, which is delayed by four clocks of the source clock from the variable divided clock, is generated in synchronization with the rising of the source clock by the clock synchronization circuit 20 and is supplied to the control circuit 12 (step S5 in FIG. 3).

Similarly, delayed clock A, which is delayed by four clocks from the variable divided clock, is generated in synchronization with the rising of the source clock by the clock synchronization circuit 22 and is supplied to the functional module 14. In addition, delayed clock B, which is delayed by four clocks from the variable divided clock, is generated in synchronization with the rising of the source clock by the clock synchronization circuit 24 and is supplied to the functional module 16 (step S6 in FIG. 3).

Figure 4:
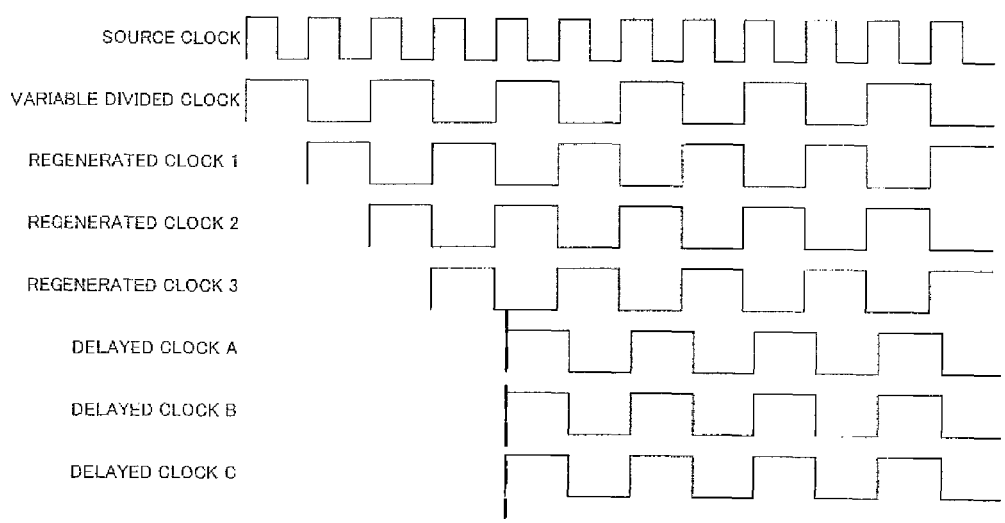
FIG. 4 is a timing diagram illustrating an example of an operation of the clock generating circuit illustrated in FIG. 1 when a variable divided clock is a two-divided clock.

FIG. 4 is a timing diagram illustrating an example of an operation of the clock generating circuit illustrated in FIG. 1 when the variable divided clock is a two-divided clock.

Figure 8:
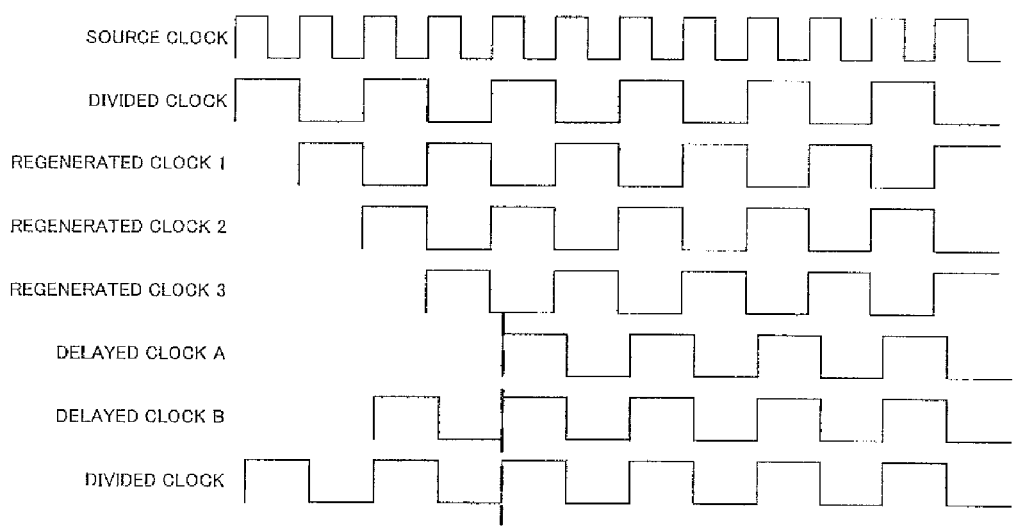
FIG. 8 is a timing diagram illustrating an example of an operation of the clock generating circuit illustrated in FIG. 7 when a divided clock is a two-divided clock.

When the variable divided clock is a two-divided clock, the variable divided clock and regenerated clocks 1 to 3 operate in the same way as the divided clock and regenerated clocks 1 to 3 illustrated in FIG. 8, as illustrated in the timing diagram. Delayed clocks A, B, and C are changed in level in synchronization with the rising of the source clock and delayed by four clocks of the source clock from the divided clock, respectively.

Accordingly, because delayed clocks A, B, and C are synchronized and matched in phase, the control circuit 12 can correctly communicate with the functional modules 14 and 16 to control the operations thereof.

Figure 5:
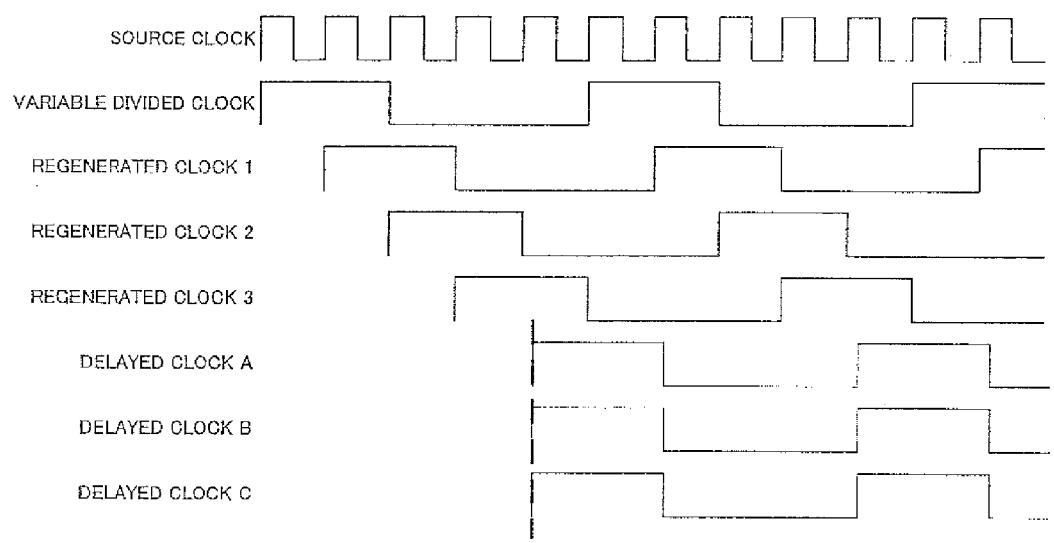
FIG. 5 is a timing diagram illustrating an example of an operation of the clock generating circuit illustrated in FIG. 1 when a variable divided clock is a five-divided clock.

FIG. 5 is a timing diagram illustrating an example of an operation of the clock generating circuit illustrated in FIG. 1 when the variable divided clock is a five-divided clock.

Figure 9:
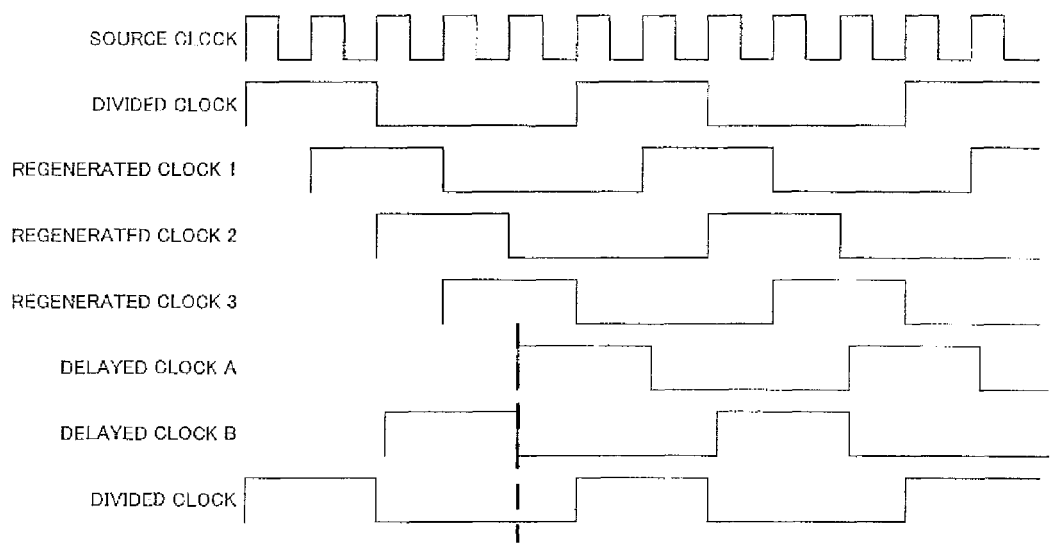
FIG. 9 is a timing diagram illustrating an example of an operation of the clock generating circuit illustrated in FIG. 7 when a divided clock is a five-divided clock.

When the variable divided clock is a five-divided clock, the variable divided clock and regenerated clocks 1 to 3 operate in the same way as the divided clock and regenerated clocks 1 to 3 illustrated in FIG. 9, as illustrated in the timing diagram. Delayed clocks A, B, and C are changed in level in synchronization with the rising of the source clock and delayed by four clocks of the source clock from the divided clock, respectively.

Accordingly, because delayed clocks A, B, and C are synchronized and matched in phase, the control circuit 12 can correctly communicate with the functional modules 14 and 16 to control the operations thereof.

The clock generating circuit 10 generates delayed clocks A, B, and C, which are delayed by four clocks of the source clock from the variable divided clock. Therefore, delayed clocks A, B, and C are always synchronized and matched in phase regardless of the division ratio of the variable divided clock. Accordingly, even when the division ratio of the variable divided clock is changed, delayed clocks A, B, and C are always synchronized and matched in phase, and, thus, the control circuit 12 can correctly communicate with the functional modules 14 and 16 to control the operations thereof.

Delayed clocks A, B, and C illustrated in FIGS. 4 and 5 are deviated from the rising of the source clock by a predetermined time. The predetermined time represents a period of time by which delayed clocks A, B, and C are delayed due to the wirings until delayed clocks A, B, and C output from FFs 32 at the final stages of the clock synchronization circuits 20, 22, and 24 illustrated in FIG. 1 are respectively supplied to the internal circuits of the functional modules 14 and 16 and the control circuit 12 corresponding thereto.

Figure 6:
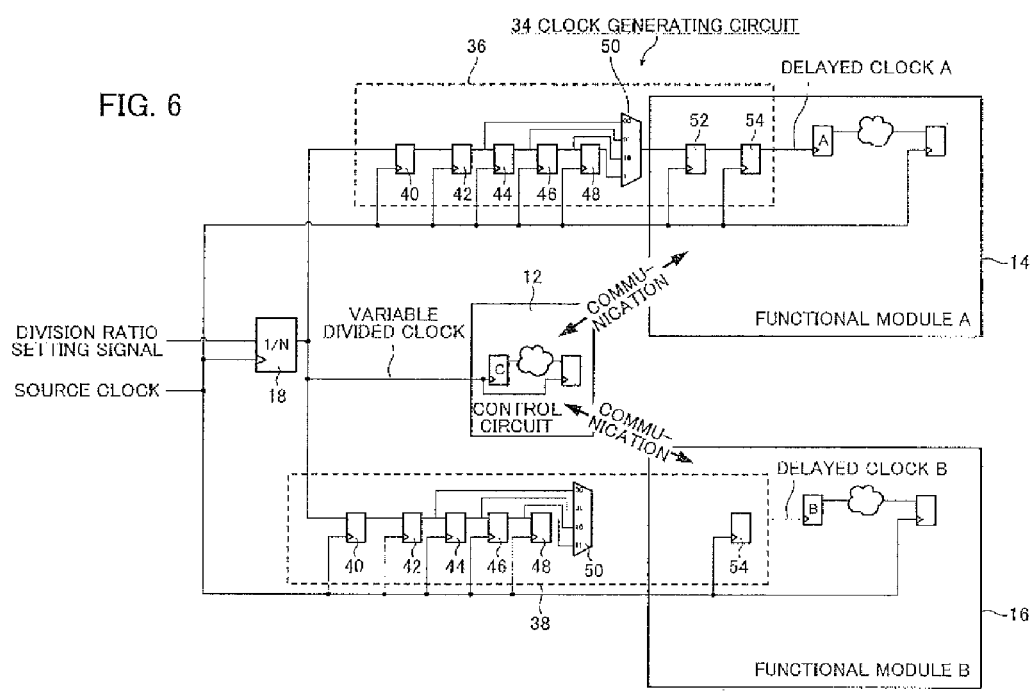
FIG. 6 is a circuit diagram illustrating a configuration of a clock generating circuit according to one or more embodiments of the present invention.

FIG. 6 is a circuit diagram illustrating a configuration of a clock generating circuit according to one or more embodiments of the present invention. The clock generating circuit 34 illustrated in the drawing comprises a variable frequency division circuit 18 and clock synchronization circuits 36 and 38.

The variable frequency division circuit 18 is the same as illustrated in FIG. 1.

The clock synchronization circuits 36 and 38 generate delayed clocks A and B, which are delayed by the number of clocks set by the division ratio setting signal from the variable divided clock, respectively, and supply generated delayed clocks A and B to the internal circuits of the functional modules 14 and 16 operating in synchronization with delayed clocks A and B, respectively.

The clock synchronization circuit 36 includes FFs 40, 42, 44, 46, and 48 at five stages connected in series, a multiplexer 50, and FFs 52 and 54 at two stages connected in series. A source clock is input to clock input terminals of the FFs 40, 42, 44, 46, 48, 52, and 54 and the variable divided clock is input to a data input terminal of FF 40 at the first stage. Regenerated clocks 1 to 4 are output from data output terminals of the FFs 42, 44, 46, and 48, respectively, and are input to the multiplexer 50. An output signal of the multiplexer 50 is input to a data input terminal of the FF 52, and delayed clock A is output from a data output terminal of FF 54 at the final stage.

The variable divided clock is delayed by one clock by each of the FFs 40, 42, 44, 46, and 48 at five stages in synchronization with the rising of the source clock. One regenerated clock out of regenerated clocks 1 to 4 is output from the multiplexer 50 in accordance with a division ratio setting signal not illustrated. Further, the output signal of the multiplexer 50 is delayed by one clock by each of FFs 52 and 54 at two stages in synchronization with the rising of the source clock. As a result, delayed clock A, which is delayed by the number of clocks set by the division ratio setting signal from the variable divided clock, is output from the clock synchronization circuit 36.

The clock synchronization circuit 38 has the same configuration as the clock synchronization circuit 36, except that FFs 52 and 54 at two stages connected in series in the clock synchronization circuit 36 are replaced with one FF 54, and operates in the same way as the clock synchronization circuit 36.

Similarly, the delay circuits and the multiplexers constituting the clock synchronization circuits 36 and 38 may be disposed inside the functional modules 14 and 16 as well as outside the functional modules 14 and 16.

Next, the operation of the clock generating circuit 34 illustrated in FIG. 6 is described below.

In the clock generating circuit 34, the source clock is divided in accordance with the division ratio setting signal by the variable frequency division circuit 18 and the variable divided clock of the division ratio corresponding to the division ratio setting signal is generated.

Subsequently, delayed clock A, which is delayed by the number of clocks set by the division ratio setting signal from the variable divided clock, is generated in synchronization with the rising of the source clock by the clock synchronization circuit 36 and is supplied to the functional module 14. In addition, delayed clock B, which is delayed by the number of clocks set by the division ratio setting signal from the variable divided clock, is generated in synchronization with the rising of the source clock by the clock synchronization circuit 38 and is supplied to the functional module 16.

The clock generating circuit 34 generates delayed clocks A and B, which are delayed by the number of clocks set by the division ratio setting signal. Accordingly, the same effects as in the clock generating circuit 10 can be obtained.

In the clock generating circuit 34, since the number of stages of the FFs constituting the clock synchronization circuits 36 and 38 or the size of the multiplexers increases as the division ratio of the variable divided clock capable of being divided by the variable frequency division circuit 18 increases, redundant circuits increase. Accordingly, the clock generating circuits 10 and 34 realize the same function, but the clock generating circuit 10 has a simpler configuration than the clock generating circuit 34 and, thus, has a merit that the circuit scale for realizing the same function can be reduced.

The specific circuit configurations of the variable frequency division circuits, the clock synchronization circuits, and the delay circuits are not particularly limited, and can use various circuit configurations for realizing the same function. The number of functional modules is not limited to two, but may any number greater than or equal to 1.

Although one of more embodiments of the present invention have been described in detail, the invention is not limited to the foregoing embodiments, and various improvements or changes may be made without departing from the gist of the invention. Additionally, although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

What is claimed is:

1. A clock generating method of generating delayed clocks to be supplied to each of one or more functional modules and a control circuit that controls operations of the one or more functional modules in a semiconductor chip on which the one or more functional modules and the control circuit are mounted, the method comprising:
generating a variable divided clock by dividing a source clock in accordance with a division ratio setting signal;
calculating one or more numbers of clocks by each of which the variable divided clock is delayed in synchronization with the source clock for each of the variable divided clocks connected to the one or more functional modules depending on a wiring distance of each of the variable divided clocks connected to the one or more functional modules from a variable frequency division circuit that generates the variable divided clock when a clock synchronization circuit delaying the variable divided clock is not provided, in order to operate the control circuit and each of the one or more functional modules in synchronization with the variable divided clock;
calculating a maximum number of clocks that is a number of clocks greater than or equal to a largest number of clocks out of the calculated numbers of clocks;
generating a first delayed clock, wherein the first delayed clock is delayed by the maximum number of clocks from the variable divided clock, in synchronization with the source clock and supplying the first delayed clock to the control circuit operating in synchronization with the first delayed clock; and generating one or more second delayed clocks, each of which is delayed by the maximum number of clocks from the variable divided clock, in synchronization with the source clock and supplying each of the one or more second delayed clocks to each of the one or more functional modules operating in synchronization with each of the one or more second delayed clocks.

2. The clock generating method according to claim 1, wherein the division ratio setting signal is input from an outside of the semiconductor chip.

3. The clock generating method according to claim 1, wherein the division ratio setting signal is input from another functional module mounted on the semiconductor chip.

4. A clock generating circuit for generating delayed clocks to be supplied to each of one or more functional modules and a control circuit that controls operations of the one or more functional modules in a semiconductor chip on which the one or more functional modules and the control circuit are mounted, the clock generating circuit comprising:

a variable frequency division circuit configured to generate a variable divided clock by dividing a source clock in accordance with a division ratio setting signal;

a first clock synchronization circuit configured to generate a first delayed clock, wherein the first delayed clock is delayed by a maximum number of clocks from the variable divided clock, in synchronization with the source clock and to supply the first delayed clock to the control circuit operating in synchronization with the first delayed clock; and one or more second clock synchronization circuits configured to generate one or more second delayed clocks, each of which is delayed by the maximum number of clocks from the variable divided clock, in synchronization with the source clock and to supply each of the one or more second delayed clocks to each of the one or more functional modules operating in synchronization with each of the one or more second delayed clocks, wherein the maximum number of clocks is a number of clocks greater than or equal to a largest number of clocks out of numbers of clocks by each of which the variable divided clock is delayed in synchronization with the source clock, and is calculated for each of the variable divided clocks connected to the one or more functional modules depending on a wiring distance of each of the variable divided clocks connected to the one or more functional modules from the variable frequency division circuit when the first clock synchronization circuit and the one or more second clock synchronization circuits are not provided, in order to operate the control circuit and each of the one or more functional modules in synchronization with the variable divided clock.

5. The clock generating circuit according to claim 4, wherein the division ratio setting signal is input from an outside of the semiconductor chip.

6. The clock generating circuit according to claim 4, wherein the division ratio setting signal is input from another functional module mounted on the semiconductor chip.

7. The clock generating circuit according to claim 4, wherein the first clock synchronization circuit comprises delay circuits at respective stages connected in series, a number of the stages corresponding to the maximum number of clocks, and delays the variable divided clock by one clock in synchronization with the source clock to generate the first delayed clock that is delayed by the maximum number of clocks from the variable divided clock.

8. The clock generating circuit according to claim 4, wherein each of the one or more second clock synchronization circuits comprises delay circuits that are connected in series at respective stages a number of which corresponding to the maximum number of clocks, and delays the variable divided clocks by one clock in synchronization with the source clock to generate the second delayed clocks that are delayed by the maximum number of clocks from the variable divided clocks.

9. The clock generating circuit according to claim 8, wherein at least one of the delay circuits at respective stages the number of which corresponds to the maximum number of clocks, is disposed outside the functional modules, and other delay circuits are disposed inside the functional modules.

* * * * *